(12) United States Patent
Kim et al.

(10) Patent No.: US 6,342,416 B1
(45) Date of Patent: Jan. 29, 2002

(54) METHOD OF MANUFACTURING A SEMICONDUCTOR MEMORY DEVICE

(75) Inventors: Ji-soo Kim; Jeong-seok Kim, both of Yongin; Kyoung-sub Shin, Sungnam, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/862,305

(22) Filed: May 23, 2001

(30) Foreign Application Priority Data

Sep. 20, 2000 (KR) ........................... 2000-55208

(51) Int. Cl.[7] ........................... H01L 21/8242

(52) U.S. Cl. ............... 438/239; 438/238; 438/761; 438/626

(58) Field of Search .................. 438/633, 624, 438/626, 666, 692, 668, 253, 254, 396–397, 257, 239, 238, 241, 791, 780, 787

(56) References Cited

U.S. PATENT DOCUMENTS 6,258,649 B1 * 7/2001 Nakamura et al. ........... 438/238

* cited by examiner

Primary Examiner—Charles Bowers
Assistant Examiner—Yennhu B. Huynh
(74) Attorney, Agent, or Firm—Volentine Francos, PLLC

(57) ABSTRACT

A semiconductor memory device and manufacturing method, including a bit line connector and a lower electrode connector that respectively connect a bit line and a capacitor lower electrode of the device to active areas of a semiconductor substrate. The connectors are formed using a line-type self-aligned photoresist mask pattern positioned on an interlevel dielectric layer formed on the substrate, which exposes only a portion of the dielectric layer corresponding to a source region and which extends in a direction which a gate electrode extends, to provide a misalignment margin. The bit line connector and the lower electrode connector are respectively formed by one-time mask processes. A contact hole for the bit line connector in a cell area, and a contact hole for a metal wiring plug in a peripheral area are simultaneously formed, alleviating etching burden during subsequent forming of a metal wiring pad.

8 Claims, 18 Drawing Sheets

METHOD OF MANUFACTURING A SEMICONDUCTOR MEMORY DEVICE

BACKGROUND OF THE INVENTION

The present application claims priority under 35 U.S.C. §119 to Korean Application No. 2000-55208 filed on Sep. 20, 2000, which is hereby incorporated by reference in its entirety for all purposes.

1. Field of the Invention

The present invention relates to a semiconductor memory device and manufacturing method thereof, and more particularly, to a dynamic random access memory device having a capacitor-over-bit line (COB) structure capable of forming a connector for connecting a bit line or a lower electrode of a capacitor with a semiconductor substrate by a one-time mask process, while providing a misalignment margin during the connector formation process, and a manufacturing method thereof.

2. Description of the Related Art

As the integration density of semiconductor devices such as dynamic RAMs (DRAMs) continues to increase, a bit line is formed under a capacitor. In association therewith, a lower electrode connector for connecting a lower electrode of a capacitor with an active area (e.g., a source region of a transistor) of a semiconductor substrate on which a DRAM is formed, and a bit line connector for connecting a bit line and another active area are formed by a two-time mask process, respectively. In this case, the lower electrode connector and the bit line connector, respectively, include a contact plug directly contacting an active area of a semiconductor substrate, and a contact pad disposed between the contact plug and the lower electrode or the bit line.

Since the contact pad and the contact plug forms a contact surface, the overall resistance of the lower electrode connector and the bit line connector increases, which in turn degrades the operating speed of a semiconductor memory device. Furthermore, to form the lower electrode connector and the bit line connector, the step of manufacturing and removing a photo mask is repeatedly performed three or four times, thereby complicating the overall process and increasing the possibility that a semiconductor substrate will suffer damage due to the repeatedly performed mask removing step. Furthermore, as the integration density of a semiconductor memory device continues to increase, there is a limit to securing a misalignment margin when forming contact holes for the contact pad and contact plug described above.

The above problems will now be described with reference to FIGS. 1–8. A semiconductor memory device shown in FIGS. 1, 2, 3, 6 and 8 is divided into a cell area C and a peripheral circuit area P, while only the cell area C of the semiconductor memory device is shown in FIGS. 4, 5 and 7. Hereinafter, a bit line contact plug and a lower electrode contact plug denote a portion directly connected with an active area of a substrate and a gate electrode, respectively, and a bit line contact pad and lower electrode contact pad denote a portion connecting the bit line contact plug with a bit line formed on the substrate and a portion connecting the lower electrode contact plug with a lower electrode, respectively. Either the bit line contact plug (or lower electrode contact plug) or the bit line contact pad (or lower electrode contact pad), or if there are the contact pad and the contact plug, the combination thereof is defined as a bit line contact connector (or lower electrode contact connector).

In FIG. 1, an active area of a semiconductor substrate 100 is defined by isolation regions 102. The isolation regions may be formed by shallow trench isolation (STI) or local oxidation of silicon (LOCOS) technique, and in the case of a highly integrated semiconductor memory device, a STI technique is preferably used. Next, an insulating layer, a polysilicon layer, a metal layer or a metal silicide layer, and a capping layer are formed over the entire surface of the semiconductor substrate 100 on a cell area C and a peripheral circuit area P and patterned to form the gate electrodes G1, G2, G3, G4, G5, G6, G7, and G8 and capping patterns 111. Each gate electrode G1, G2, G3, G4, G5, G6, G7, or G8 is composed of a gate electrode insulating pattern 104, a polysilicon pattern 108, and a metal pattern or a metal silicide pattern 110. Then, using each gate electrode G1, G2, G3, G4, G5, G6, G7, or G8 as a mask, ions having the opposite conductive type to the semiconductor substrate 100 are implanted into the semiconductor substrate 100 to form drain and source regions 103 and 105.

The capping layer or the capping pattern 111 may be composed of a material having high selectivity with respect to an interlevel dielectric layer 112 which will later be formed, such as for example a silicon nitride layer, an aluminum oxide layer, or a tantalum oxide layer. Subsequently, an insulating layer is formed over the entire surface of the semiconductor substrate 100 on which the gate electrodes G1, G2, G3, G4, G5, G6, G7, or G8 been formed, and etched back to form a spacer 106 along the sidewall of the gate electrodes G1, G2, G3, G4, G5, G6, G7, or G8 and capping pattern 111. The spacer 106 may be composed of a material having high selectivity with respect to the interlevel dielectric layer 112. Here, the structures comprised of the gate electrodes G1, G2, G3, G4, G5, G6, G7, or G8, the capping pattern 111 and the spacers 106 are referred to as gate electrode structures.

Meanwhile, after having formed the spacer 106, impurity ions of high concentration are implanted into the semiconductor substrate 100 to form the drain and source regions 103 and 105 having a lightly doped drain and source (LDD) structure, thereby completing first through eighth transistors T1, T2, T3, T4, T5, T6, T7, and T8. The first through fifth transistors T1, T2, T3, T4, and T5 are formed on the cell area C, while the sixth through the eight transistors T6, T7, and T8 are formed on the peripheral circuit area P. Hereinafter, the drain and source regions having a LDD structure are referred to as drain and source regions.

In FIG. 1, the transistors T1, T2, T3, and T4, or T6 and T7 between the isolation regions 102 have channels of the same conductive type. The source region 105 of the second transistor T2 is in common with that of the first transistor T1, and the drain region 103 of the second transistor T2 is in common with that of the third transistor T3. Meanwhile, the fifth transistor T5 may have the same or opposite conductive type of channel. To have a channel of the opposite conductive type to a substrate, a well (not shown) of the opposite conductive type to the substrate is formed within the substrate to form source and drain regions of an adjacent transistor.

A planarized first interlevel dielectric layer 112 is formed over the entire surface of the semiconductor substrate 100 on the cell area C and the peripheral circuit area P on which the spacer 106 has been formed. Subsequently, the first interlevel dielectric layer 112 on the cell area C is etched to form first contact holes exposing the drain and source regions 103 and 105 of the transistors T1, T2, T3, and T4. At this point, if the capping patterns 111 and the spacers 106 are composed of materials having high selectivity to the first interlevel dielectric layer 112, the first contact holes are formed using a self-aligned etching by the capping patterns 111 and the spacers 106. Next, a polysilicon layer 114 formed of a conductive material is formed on the first interlevel dielectric layer 112 including the first contact holes.

Referring to FIG. 2, chemical mechanical polishing (CMP) or etchback is performed on the polysilicon layer 114 until the top surface of the first interlevel dielectric layer 112 is substantially exposed to form a bit line contact plug 114b and lower electrode bit line contact plugs 114a and 114c connected to the drain region 103 and the source region on the cell area C of the semiconductor substrate 100, respectively. Next, a planarized second interlevel dielectric layer 116 is formed over the entire surface of the semiconductor substrate 100 including the peripheral circuit area P and bit line contact plug 114b and the lower electrode bit line contact plugs 114a and 114c on the cell area C. Then, the second interlevel dielectric layer 116 overlying the bit line contact plug 114b is etched to form a second contact hole. At the same time that the second contact hole is formed, the second interlevel dielectric layer 116 and the first interlevel dielectric layer 112 formed at the different positions are etched to form a third contact hole exposing an active area of the transistor T5 disposed on the cell area C, such as the drain region 103. Meanwhile, a process of forming a fourth contact hole exposing the metal or metal silicide pattern 110 of the gate electrode G6 on the peripheral circuit area P includes a step of etching the second interlevel dielectric layer 116 to expose the capping pattern 111 of the sixth transistor T6, which is similar to an initial step in the process of forming the third contact hole, and a subsequent step of removing the capping pattern 111 to expose the metal layer or the metal silicide pattern 110. After having formed the second through the fourth contact holes in this way, a polysilicon layer 118, which is a conductive material, is formed on the second interlevel dielectric layer 116 to thereby fill the second through the fourth contact holes.

In FIG. 3, CMP or etchback is performed on the polysilicon layer 118 until the top surface of the second interlevel dielectric layer 116 is exposed to form a bit line contact pad 118a and bit line contact plugs 118b and 118c. The bit line contact plugs 118b and 118c may be also called bit line contact pads, but in this specification bit line contact plug is used. A bit line connector for connecting the active area 103 between the transistors T2 and T3 and a bit line 120 is comprised of the bit line contact plug 114b and the bit line contact pad 118a. A bit line connector connecting the transistor T5 and the bit line 120 is the bit line contact plug 118b, while a bit line connector connecting the transistor T6 to the bit line 120 is the bit line contact plug 118c.

Next, a metal anti-diffusion layer and a metal layer are provided over the semiconductor substrate 100 including the bit line contact pad 118a and the bit line contact plugs 118b and 118c and patterned to form a bit line 120. Titanium nitride (TiN) or titanium tungsten (TiW) is used as the metal anti-diffusion layer, while Ti, W or Al is used as the metal layer.

To protect the bit line from a subsequent integration process, an insulating layer is formed over the entire surface of the semiconductor substrate including the bit line 120 and is subjected to etchback to form a capping pattern 122 including a spacer. The insulating layer formed on the cell area C and the peripheral circuit area P is removed except for a portion in which the bit line 120 is formed, thereby shielding only the bit line 120 on the peripheral circuit area P.

Subsequently, a planarized third interlevel dielectric layer 124 is formed over the entire surface of the semiconductor substrate 100 on which the capping pattern 122 has been formed. Using a contact-type photoresist mask pattern (160 of FIG. 5), the third interlevel dielectric layer 124 and the underlying second interlevel dielectric layer 116 are etched to form a fifth contact hole 125 exposing the lower electrode contact plugs 114a and 114c of a capacitor.

Meanwhile, a plan view in which the contact-type photoresist mask pattern (160 of FIG. 5) used in forming the fifth contact hole 125 is disposed is shown in FIG. 4. Only a portion denoted by reference numeral 150 in FIG. 4 is exposed by the contact-type photoresist mask pattern (160 of FIG. 5), which corresponds to the underlying third interlevel dielectric layer 124.

More specifically, in FIG. 4, the first through fourth gate electrodes G1, G2, G3 and G4 extending in the Y-axis direction are disposed in parallel with respect to each other along the X-axis direction, and the bit lines 120 are disposed interposing the second interlevel dielectric layer 116 on the first through fourth gate electrodes G1, G2, G3, and G4 so that both meet at right angles. The lower electrode contact plugs 114a and 114c are positioned between the gate electrodes G1 and G2, and between the gate electrodes G3 and G4, respectively. The bit line contact plug 114b is positioned between the second and third gate electrodes G2 and G3 in a direction in which the gate electrodes G2 and G3 extend. The bit line capping pattern 122 and the overlying third dielectric layer 124 are not shown in FIG. 4.

In a cross-sectional view (not shown) taken along line VI—VI of FIG. 4, if an etching process for forming the fifth contact hole 125 is performed, the second and third interlevel dielectric layer 116 and 124 between the second and third gate electrodes G2 and G3 are not etched, while the second and third interlevel dielectric layer 116 and 124 between the first and second gate electrodes G1 and G2, and between the third and fourth gate electrodes G3 and G4 are removed to form the fifth contact holes 125 as shown in FIG. 3.

On the other hand, referring to FIG. 5, which is a cross sectional view taken along line V—V of FIG. 4, the lower electrode contact plug 114a self-aligned between the first and second gate electrodes extends along the gate electrodes on the semiconductor substrate 100. The second interlevel dielectric layer 116 is formed perpendicularly to the gate electrode on the lower electrode contact plug 114a. The bit lines 120 covered with the capping pattern 122 are formed on top of the second interlevel dielectric layer 116, each of which is separated in the Y direction in which the gate electrode extends. Next, the third interlevel dielectric layer 124 is disposed on the second interlevel dielectric layer 116 including the capping pattern 122, on top of which the contact-type self-aligned photoresist mask pattern 160 is positioned for forming the fifth contact hole 125 by etching the second and third interlevel dielectric layers 116 and 124 between the capping patterns 122.

Subsequently, as shown in FIG. 7, using the mask pattern 160 as an etch mask, the third and second interlevel dielectric layers 124 and 116 are etched to form the fifth contact hole 125, and then the contact-type self-aligned photoresist mask pattern 160 is removed. Next, the polysilicon layer 126 is formed over the entire surface of the semiconductor substrate 100 and subjected to etchback or CMP until the top surface of the third dielectric layer 124 is exposed.

Specifically, FIG. 6 shows a cross sectional view of a semiconductor memory device including the cell area C on which etchback or CMP has been performed on the polysilicon layer 126, taken along line VI—VI of the X-axis direction of FIG. 4, while FIG. 7 shows a cross-sectional view of the cell area C taken along line V—V of the Y-axis direction. That is, in FIGS. 6 and 7, the polysilicon layer 126 undergoes CMP to form capacitor lower electrode contact pads 126a and 126b.

Subsequently, as shown in FIG. 6, an etching stop layer 128 provided with an opening is formed on the third interlevel dielectric layer 124 on the cell area C on which the lower electrode contact pads 126a and 126b have been formed, on top of which a lower electrode 130, a dielectric layer 132, and an upper electrode 134 constituting a capacitor are formed.

In FIG. 8, a planarized fourth interlevel dielectric layer 136 is formed over the entire surface of the semiconductor substrate 100 on the cell area C on which the capacitor has been formed, and on the peripheral circuit area P. A predetermined portion of the fourth interlevel dielectric layer 136 is etched to form a sixth contact hole exposing a portion of the upper electrode 134 on the cell area C. After having formed the sixth contact hole, predetermined portions of the third interlevel dielectric layer 124, the capping patterns 122 and 111, and the first and second interlevel dielectric layers 112 and 116 are etched to form seventh, eighth, and ninth contact holes. Here, the seventh, eighth, and ninth contact holes expose the bit line 120 on the peripheral circuit area P, the active area 103 of the semiconductor substrate 100 on the peripheral circuit area P, and the metal or metal silicide pattern 110 of the gate electrode G8, respectively. A metal layer (not shown) is formed on the fourth interlevel dielectric layer 136 in which the sixth through ninth contact holes have been formed in such a way as to fill the sixth through ninth contact hole, and then CMP or etchback is performed on the metal layer to form metal wiring contact plugs 138a, 138b, 138c, and 138d. In a subsequent process, a metal layer (not shown) is formed on the fourth interlevel dielectric layer 136 and patterned to form metal wiring contact pads 140a, 140b, 140c, and 140d.

While the bit line contact plugs and the lower electrode contact plugs are simultaneously formed using one mask, a three-time mask process is required in order to connect the bit line 120 and the lower electrode 130 to the active areas 103 and 105 of the semiconductor substrate 100. That is, to form the bit line connector, a first mask for the bit line contact plug 114b formed simultaneously with the lower electrode contact plugs 114a and 114c, and a second mask for forming the bit line contact pad 118a are required. To form the lower electrode connector, a first mask and a third mask for forming the lower electrode contact pads 126a and 126b are required. Thus, a process for forming the bit line connector and the lower electrode connector is complicated.

Meanwhile, the bit line 120 is connected to the area 103 of the semiconductor substrate 100 through the bit line contact plug 114b and the bit line contact pad 118a, while the lower electrode 130 is connected to the active area 105 of the semiconductor substrate 100 through the lower electrode contact plugs 114a and 114c and the lower electrode contact pads 126a and 126b. Thus, the bit line connector and the lower electrode connector have contact surfaces within them, which increases the overall resistance due to occurrences of contact resistance. The increased resistance, in turn, degrades the operating speed of transistors and capacitors.

Furthermore, since the fifth contact holes 125 for forming the lower electrode contact plug 126a and 126b are separated by 1 feature size (F) and 3 F in the Y- and X-axis directions, respectively, an alignment margin for the photo-resist mask pattern 160 is not sufficient. That is, if the photoresist mask pattern 160 is misaligned in the Y-axis direction, the adjacent bit lines 120 are connected to each other to cause a bridge. Furthermore, if the third interlevel dielectric layer 124 for the fifth contact hole 125 is overetched, the capping pattern 122 is removed to expose the bit line 120. As a result, an electrical short occurs between the bit line 120 and the lower electrode 130.

Thus, to provide for a misalignment margin, the thickness of the capping pattern 122, which is a hard mask formed on the bit line 120, needs to increase. However, an increase in the thickness of capping pattern 122 makes it difficult to fill the space between the bit line structures 120 and 122 with a material of the third interlevel dielectric layer 124 where the fifth contact hole 125 will be formed without a void forming.

To fill the space between the bit line structures 120 and 122 without forming a void, liquid spin-on glass (SOG) and borophosphosilicate glass (BPSG) may be used. However, oxygen contained in the SOG or BPSG penetrates under the bit line 120 to oxidize the bit line 120, thereby causing the problem of lifting the bit line 120.

Furthermore, if the mask pattern 160 is misaligned in the X- and/or Y-axis directions, an overlay margin with the gate electrodes G1, G2, G3, and G4 and the hard mask 122 formed on the bit line 120 becomes smaller, thereby offering low selectivity during a self-aligned contact (SAC) etching process.

Meanwhile, when forming the fifth contact hole 125 using the contact-type self-aligned mask pattern 160, since the mask pattern 160 does not have high selectivity with respect to the third interlevel dielectric layer 124, a portion of the underlying third interlevel dielectric layer 124 is removed, and a bridge defect occurs between the adjacent bit lines 120.

To form the metal wiring contact plugs 138b, 138c, and 138d on the peripheral circuit area P, thick third and fourth interlevel dielectric layers 124 and 136, and the first and second interlevel dielectric layers 112 and 116 must be etched. This imposes a burden on an etching process for forming the fifth contact hole 125.

SUMMARY OF THE INVENTION

The present invention is therefore directed to a semiconductor memory device, and a method of forming a semiconductor memory device, which substantially overcome one or more of the problems due to the limitations and disadvantages of the related art.

To solve the above problems, it is an objective of the present invention to provide a semiconductor memory device for reducing the number of masks used in forming a lower electrode connector and a bit line connector while suppressing an increase of resistance thereof, and a manufacturing method thereof.

It is another objective of the present invention to provide a semiconductor memory device for providing a misalignment margin in forming the lower electrode connector and the bit line connector, and a manufacturing method thereof.

It is still another objective of the present invention to provide a semiconductor memory device capable of reducing a burden on an etching process for forming a metal wiring contact plug formed on a peripheral circuit area of the semiconductor memory device, and a manufacturing method thereof.

It is yet still another objective of the present invention to provide a semiconductor memory device for preventing a bit line from lifting off of a cell area, and a manufacturing method thereof.

The present invention provides a semiconductor memory device for reducing the number of masks used in forming a lower electrode connector and a bit line connector and suppressing an increase of resistance thereof, while providing a misalignment margin in forming the lower electrode connector. The semiconductor memory device according to the present invention includes transistors having gate electrode structures and source and drain regions and the interlevel dielectric layer. The gate electrode structure is formed on the substrate, and includes a gate electrode structure including a gate electrode, a gate electrode capping pattern formed on top of the gate electrode, and sidewall spacers formed on the sidewalls of the gate electrode and the gate electrode capping pattern. The interlevel dielectric layer is formed over the substrate on which the transistors have been formed, and includes a bit line contact hole and a lower electrode contact hole. The interlevel dielectric layer is formed of a material having high selectivity with respect to the gate electrode capping pattern and the sidewall spacers. A conductive bit line connector is formed within the bit line contact hole of the interlevel dielectric layer and is connected to the drain region. A bit line is formed on the interlevel dielectric layer in which the bit line connector has been formed and electrically connected to the bit line connector. The bit line is covered by a bit line capping pattern. A capacitor lower electrode connector is formed within the lower electrode contact hole of the interlevel dielectric layer and extends to be the same level as the top surface of the bit line capping pattern. Then, a capacitor including a lower electrode, a dielectric layer, and an upper electrode is formed on the capacitor lower electrode connector.

Here, the interlevel dielectric layer is a silicon oxide layer, a silicon nitride layer, a borosilicate glass (BSG) layer, a borophospho-silicate glass (BPSG) layer, a tetraethylorthosilicate (TEOS) layer, an ozone-TEOS layer, a plasma enhanced-TEOS (PE-TEOS) layer, an undoped silicate glass (USG) layer, or a combination thereof, and the gate electrode capping pattern, the bit line capping pattern and the sidewall spacers are formed of different materials from the interlevel dielectric layer, such as a silicon nitride layer, an aluminum oxide layer, a tantalum oxide layer, a silicon carbide layer or a combination thereof.

To prevent oxidation of the bit line, an anti-oxidation layer such as a silicon nitride layer or a silicon oxynitride layer is further interposed between the interlevel dielectric layer and the bit line.

The present invention also provides a semiconductor memory device for reducing a burden on an etching process for forming a metal wiring contact plug formed in a peripheral circuit area. The semiconductor memory device includes a first transistor including a first gate electrode, a first source region, and a first drain region, which is formed on the substrate, and a first interlevel dielectric layer formed over the substrate including the first transistor and having a bit line contact hole and a lower electrode contact hole formed in the cell area and a metal wiring contact hole formed in the peripheral circuit area. Furthermore, the semiconductor memory device further includes a bit line connector, a bit line capping pattern covering the bit line, a capacitor lower electrode connector, a capacitor, and a lower metal wiring contact plug. The bit line connector is formed within the bit line contact hole of the first interlevel dielectric layer and electrically connected to the drain region, and the bit line is formed on the interlevel dielectric layer in which the bit line connector has been formed and electrically connected to the bit line connector. The capacitor lower electrode connector is formed within the lower electrode contact hole of the interlevel dielectric layer and extends to be the same level as the bit line capping pattern. The capacitor including a lower electrode, a dielectric layer, and an upper electrode is formed on the capacitor lower electrode connector, and the lower metal wiring contact plug is formed within the metal wiring contact hole and connected to the drain region or the gate electrode positioned on the peripheral circuit area.

To form the bit line contact hole and the lower electrode contact hole using a self-aligned etching, the transistor further includes a gate electrode capping pattern formed on top of the gate electrode and sidewall spacers formed at the sidewalls of the gate electrode. In this case, the gate electrode capping pattern, the sidewall spacers, and the bit line capping pattern are formed of materials having high selectivity to the first interlevel dielectric layer.

The semiconductor memory device further includes a planarized second interlevel dielectric layer, which overlies the capacitor and is formed over the entire surface of the substrate including the cell area and the peripheral circuit area, and which includes a metal wiring contact hole provided in the peripheral circuit area. The metal wiring contact hole is filled with a conductive material to form an upper metal contact plug electrically connected to the lower metal contact plug.

Meanwhile, the bit line capping pattern is disposed on the bit line and the first interlevel dielectric layer, thereby alleviating a burden on etching when forming the metal wiring contact hole formed in the second interlevel dielectric layer.

The present invention also provides a method of manufacturing a semiconductor memory device which reduces the number of masks used in forming a lower electrode connector and a bit line connector and suppresses an increase of resistance thereof while providing a misalignment margin in forming the lower electrode connector. According to the manufacturing method, transistors are formed on the substrate, wherein each transistor includes a gate electrode structure having a gate electrode, a gate electrode capping pattern formed on top of the gate electrode, and gate electrode sidewall spacers formed on the sidewalls of the gate electrode and the gate electrode capping pattern, a source region, and a drain region. A first interlevel dielectric layer including a bit line contact hole is formed of a material having high selectivity with respect to the gate electrode capping pattern and the sidewall spacers over the entire surface of the substrate including the transistors. A bit line connector electrically connected to the drain region is formed by filling the bit line contact hole with a conductive material. Then, a bit line is formed on the first interlevel dielectric layer including the bit line connector, and then a bit line capping pattern covering the bit line is formed. A second interlevel dielectric layer is formed of a material having high selectivity with respect to the gate electrode capping pattern and the gate electrode sidewall spacers over the entire surface of the first interlevel dielectric layer on which the bit line capping pattern has been formed. A mask pattern exposing a portion of the second interlevel dielectric layer which corresponds to the source region in the second interlevel dielectric layer and extends along the direction of bit line arrangement is formed on the second interlevel dielectric layer. The first and second interlevel dielectric layers are etched using the mask pattern to form a capacitor lower electrode contact hole exposing the source region. The lower electrode contact hole is filled with the conductive material from the bottom thereof up to the top surface of the bit line capping pattern to form a capacitor lower electrode connector positioned at the same level as the bit line capping pattern. Then, a capacitor including a lower electrode, a dielectric layer, and an upper electrode is formed on top of the capacitor lower electrode connector.

More specifically, to form the lower electrode contact hole, the entire exposed portion of the second interlevel dielectric layer is removed and the first interlevel dielectric layer is etched using the bit line capping pattern. Then, to form the capacitor lower electrode connector, after forming a conductive material layer over the entire surface of the substrate including the lower electrode contact hole, chemical mechanical polishing (CMP) or etchback is performed on the entire surface of the substrate on which the conductive material layer has been formed until the top surface of the bit line capping layer is substantially exposed.

To prevent lifting due to oxidation of the bit line, a material layer for preventing oxidation of the bit line is formed between the steps of forming the first interlevel dielectric layer and forming the bit line contact hole, the bit line anti-oxidation material layer is etched to form an opening for opening the bit line contact hole, and the opening is filled with a conductive material up to the top thereof.

To reduce a burden on an etching process for forming a metal wiring contact plug formed in a peripheral circuit area of the semiconductor memory device, after preparing a substrate of the semiconductor memory device including a cell area and a peripheral circuit area, transistors are formed on the substrate including the cell area and the peripheral circuit area, wherein each transistor includes a gate electrode structure having a gate electrode, a gate electrode capping pattern formed on top of the gate electrode, and sidewall spacers formed at the sidewalls of the gate electrode and the gate electrode capping pattern, a source region, and a drain region. Then, a first interlevel dielectric layer is formed over the entire surface of the substrate including the transistors, and the first interlevel dielectric layer is etched to form a bit line contact hole on the cell area and a metal wiring contact hole on the peripheral circuit area at the same time. The bit line contact hole and the metal wiring contact hole are filled with a conductive material to form a bit line connector connected to the drain region formed in the cell area and a metal contact connector connected to the drain region or the gate electrode formed in the peripheral circuit area at the same time.

Here, to form the bit line connector and the metal contact connector, a conductive layer of a conductive material such a polysilicon or metal, or a combination thereof, is formed on the first interlevel dielectric layer in which the bit line contact hole and the metal wiring contact hole have been formed. CMP or etchback is performed on the conductive layer until the top surface of the first interlevel dielectric layer is substantially exposed.

Furthermore, after the step of forming the bit line connector and the metal contact connector, a bit line is formed on a predetermined portion of the first interlevel dielectric layer in which the bit line connector and the metal contact connector have been formed and connected to the bit line connector. Continuously, a bit line capping pattern covering the bit line is formed, wherein the bit line capping pattern positioned on the cell area covers only the bit line on the cell area and the bit line capping pattern positioned on the peripheral circuit area covers the bit line and the top surfaces of the first interlevel dielectric layer and the metal contact connector on the peripheral circuit area. Here, the bit line capping pattern positioned on the peripheral circuit area is used as an etch stop layer during dry etching for etching the interlevel dielectric layer overlying the capacitor to form the metal wiring contact hole.

After forming the bit line capping pattern, the manufacturing method further includes the steps of: forming a second interlevel dielectric layer over the entire surface of the substrate on which the bit line capping pattern has been formed; forming a mask pattern on the second interlevel dielectric layer, the mask pattern exposing a portion of the second interlevel dielectric layer which corresponds to the source region on the second interlevel dielectric layer and extends along the direction of bit line arrangement; etching the first and second interlevel dielectric layers using the mask pattern and forming a capacitor lower electrode contact hole exposing the source region; filling the lower electrode contact hole with the conductive material from the bottom thereof up to the top surface of the bit line capping pattern to form a capacitor lower electrode connector positioned at the same level as the bit line capping pattern; and forming a capacitor including a lower electrode, a dielectric layer, and an upper electrode on top of the capacitor lower electrode connector.

Furthermore, prior to the step of forming the bit line, a bit line anti-oxidation material layer having an opening for opening the bit line connector is formed of a silicon nitride layer or a silicon oxynitride layer on the first interlevel dielectric layer and the opening of the bit line anti-oxidation material layer is filled with a conductive material up to the top thereof, thereby preventing the oxidation of the bit line.

More specifically, to form the lower electrode contact hole, the exposed portion of the second interlevel dielectric layer is removed and the first interlevel dielectric layer is removed using the bit line capping pattern.

Specifically, to form the lower electrode connector, a conductive material layer is formed over the entire surface of the substrate including the lower electrode contact hole and CMP or etchback is performed over the entire surface of the substrate on which the conductive material layer has been formed until the top surface of the bit line capping pattern is substantially exposed.

Furthermore, to form the bit line capping pattern, a bit line capping layer is formed over the entire surface of the semiconductor substrate including the cell area and the peripheral circuit area, and then a mask pattern exposing the cell area is formed on the bit line capping layer. Then, the bit line capping layer positioned on the cell area is etched back using the mask pattern to form the bit line capping pattern, and the mask pattern is removed. Thus, since only the bit line capping layer positioned on the cell area is etched, a burden on the etching process can be alleviated. Furthermore, the bit line capping pattern on the peripheral circuit area can be used as an etch stop layer in forming the metal wiring contact hole.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
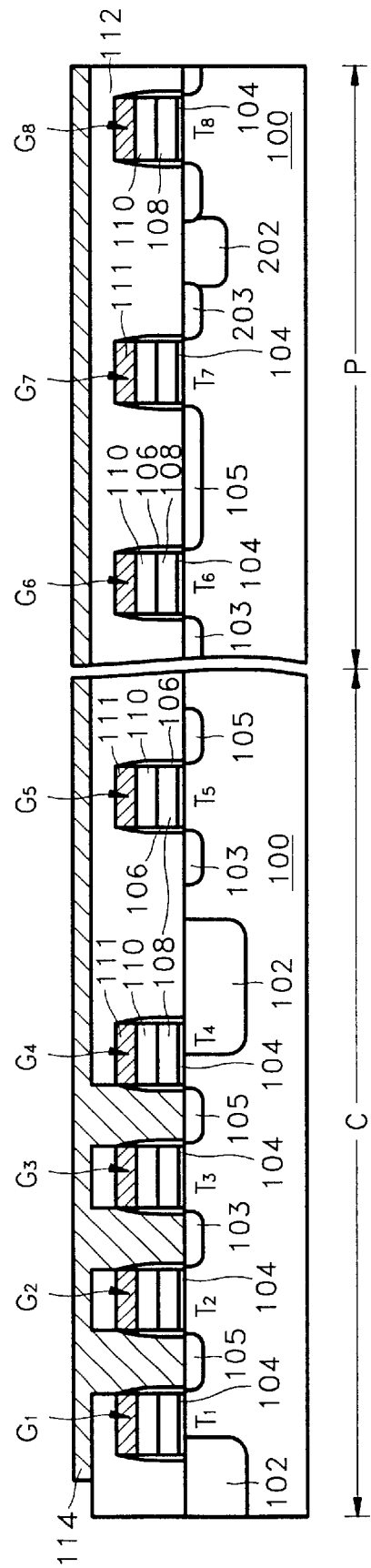
FIGS. 1–8 show a method of manufacturing a conventional semiconductor memory device.
Figure 2:
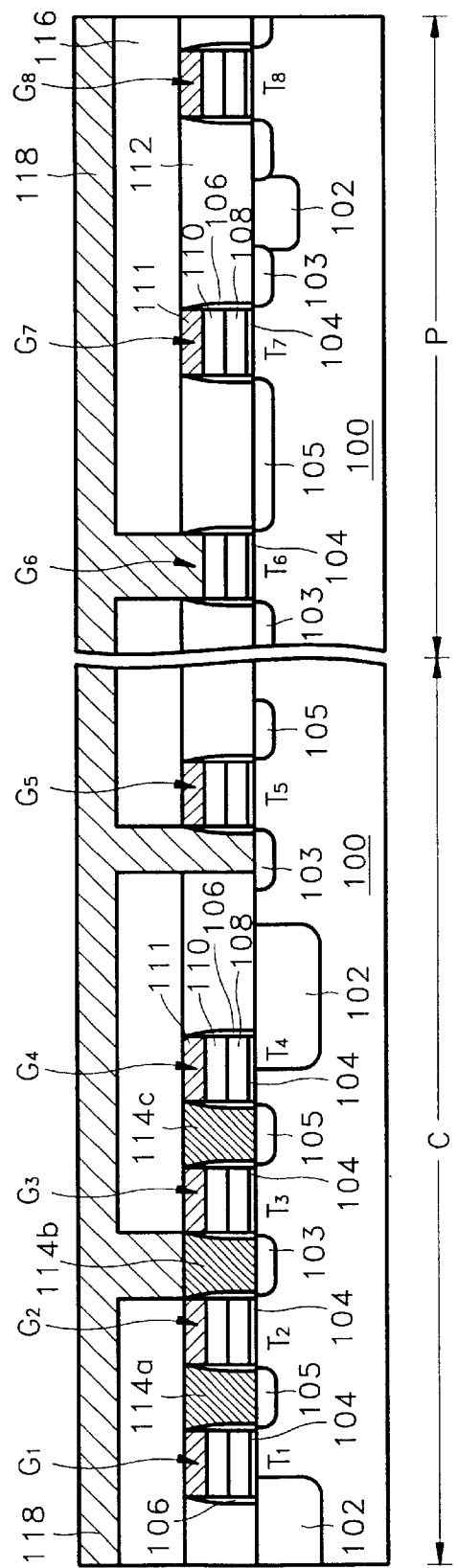
Figure 3:
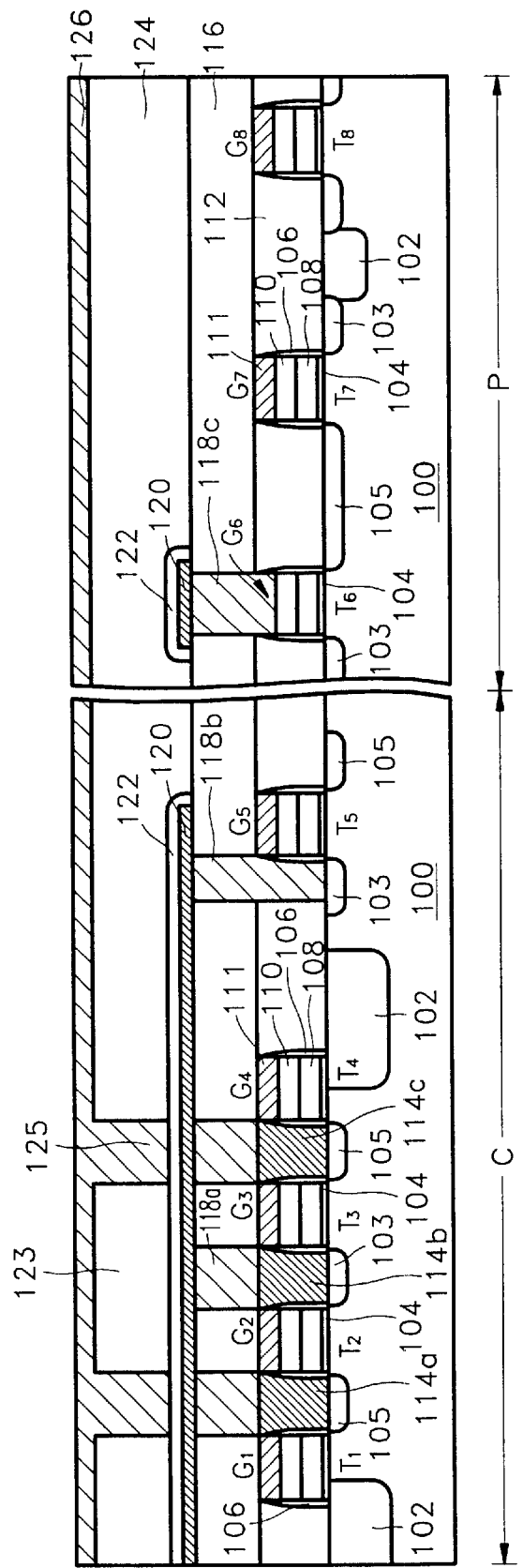
Figure 4:
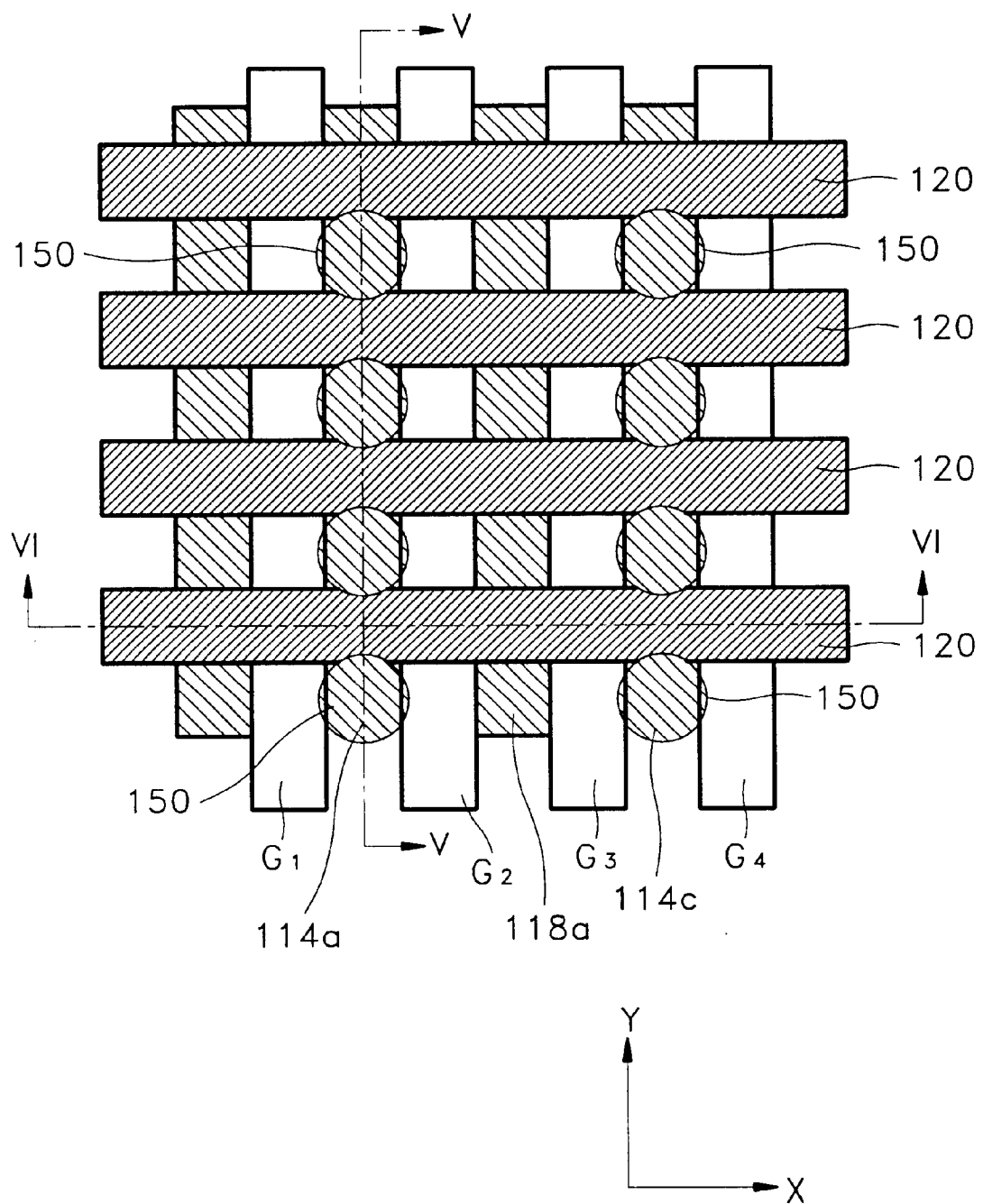
Figure 5:
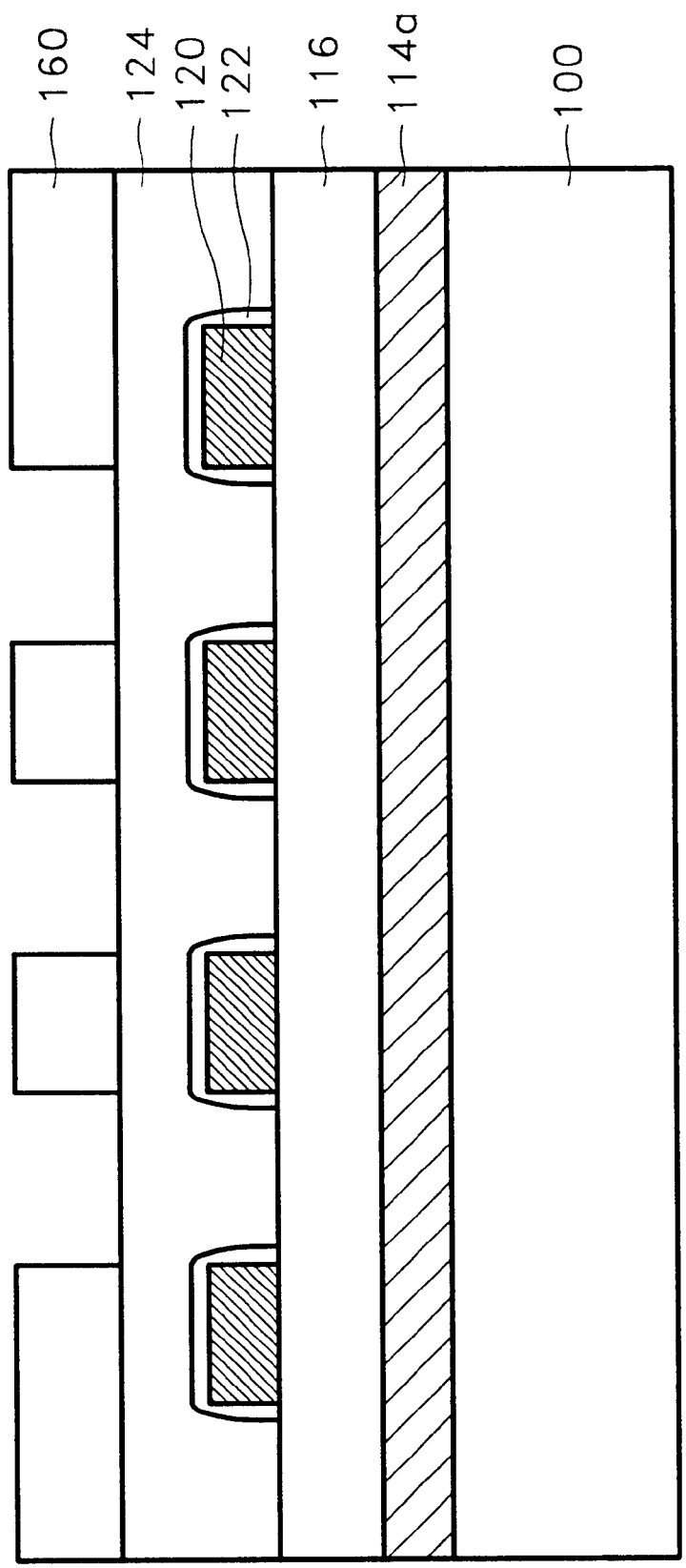
Figure 6:
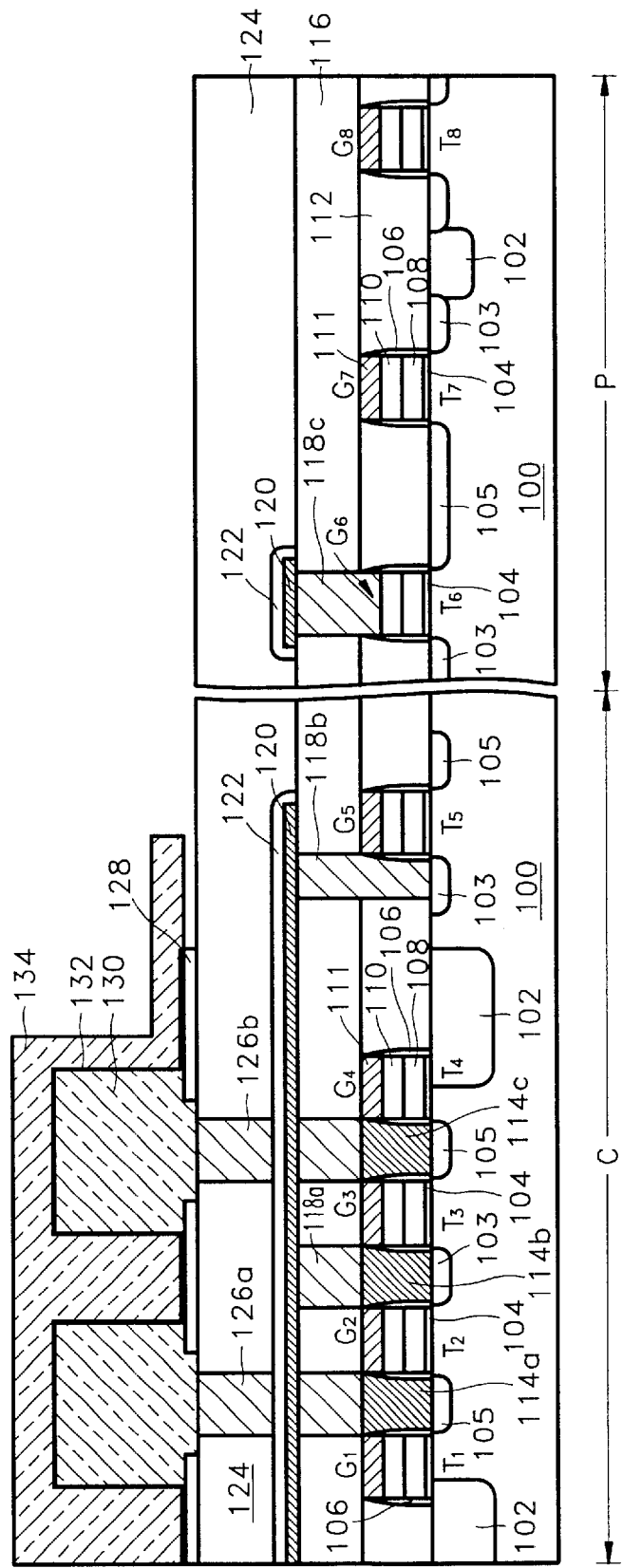
Figure 7:
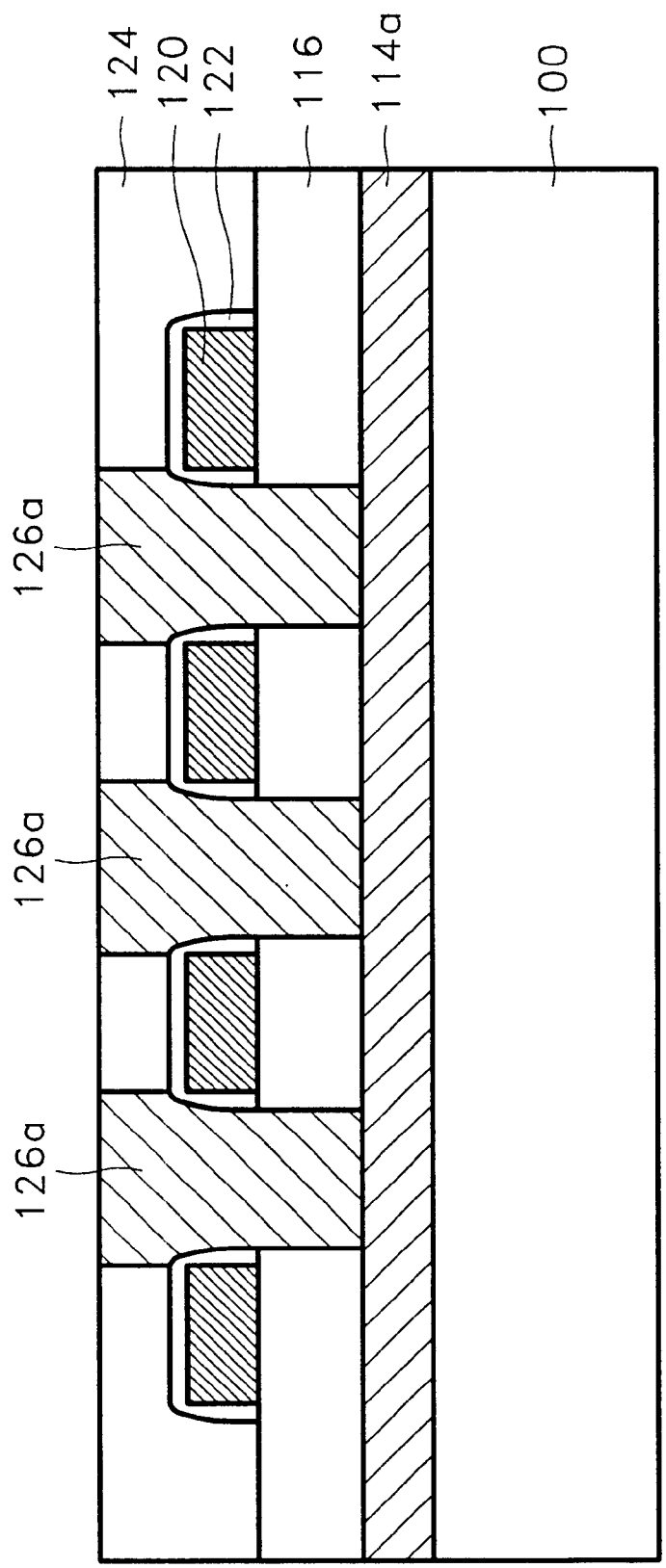
Figure 8:
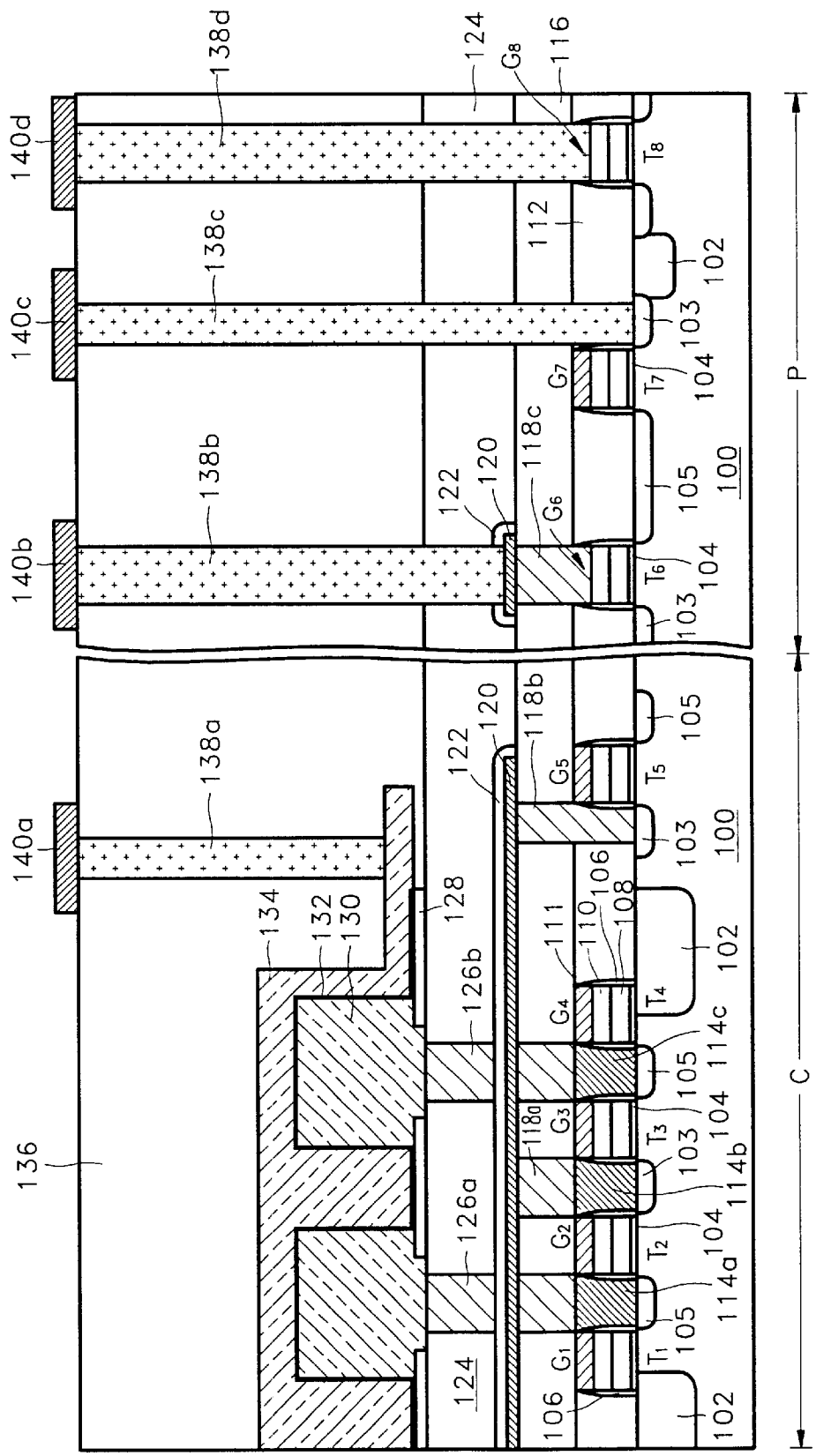
Figure 9:
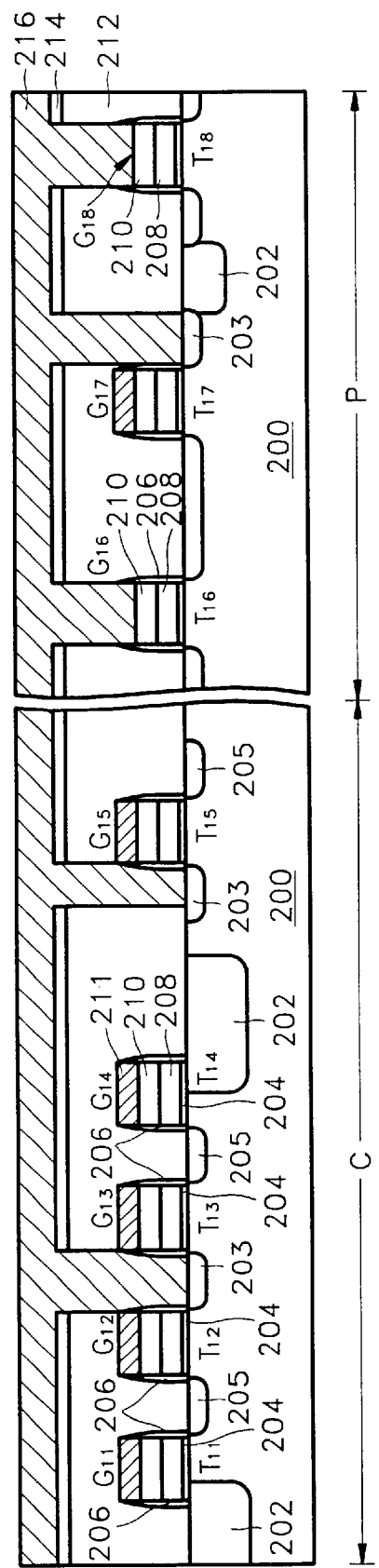
FIGS. 9–19 show a method of manufacturing a semiconductor memory device according to the present invention.

Semiconductor memory devices shown in FIGS. 9, 10, 18 and 19 are divided into a cell area C and a peripheral circuit area C, while only cell areas C of semiconductor memory devices are shown in FIGS. 11–17. In FIG. 9, an active area of a semiconductor substrate 200 is defined by isolation regions 202. The isolation regions 202 may be formed using shallow trench isolation (STI) or local oxidation of silicon (LOCOS) technique, and in the case of a highly integrated semiconductor memory device, a STI technique is preferably used.

Next, an insulating layer, a polysilicon layer, a metal layer or a metal silicide layer, and a capping layer are formed over the entire surface of the semiconductor substrate 200 on a cell area C and a peripheral circuit area P, and are patterned to sequentially form the gate electrodes G11, G12, G13, G14, G15, G16, G17, and G18 and capping patterns 211. Each of the gate electrodes G11, G12, G13, G14, G15, G16, G17 and G18 includes a gate insulating pattern 204, a polysilicon pattern 208, and metal or metal silicide pattern 210. Then, ions having opposite conductive type to the semiconductor substrate 200 are implanted into the semiconductor substrate 200 to form drain and source regions 203 and 205. The source region 205 of a transistor including the gate electrode G12 is in common with that of a transistor including the gate electrode G11, while the drain region 203 of a transistor including the gate electrode G12 is in common with that of a transistor including the gate electrode G13.

The gate electrode capping pattern 211 may be formed of a material having high selectivity with respect to an interlevel dielectric layer 212 which will later be formed, such as for example a silicon nitride layer, an aluminum oxide layer, a silicon carbide layer or a tantalum oxide layer. Subsequently, an insulating layer is formed over the entire surface of the semiconductor substrate 200 on which the gate electrodes G11, G12, G13, G14, G15, G16, G17, and G18 have been formed, and is etched back to form spacers 206 along the sidewalls of the gate electrodes G11, G12, G13, G14, G15, G16, G17, and G18 and to form capping patterns 211. The spacers 206 may be composed of a material having high selectivity with respect to the interlevel dielectric layer 212 that will later be formed. Here, structures comprised of the gate electrodes G11, G12, G13, G14, G15, G16, G17, and G18, the capping pattern 211 and the spacer 206 are referred to as gate electrode structures.

Meanwhile, after having formed the gate electrode structures including the spacers 206, impurity ions of high concentration are implanted into the semiconductor substrate 200 to form the drain and source regions 203 and 205 having a lightly doped drain and source (LDD) structure, thereby completing transistors T11, T12, T13, T14, T15, T16, T17, and T18. The drain and source regions 203 and 205 shown in FIGS. 9, 10, and 12–19 have a LDD structure. Hereinafter, source and drain regions having the LDD structure are referred to as source and drain regions.

A planarized first interlevel dielectric layer 212 and a bit line anti-oxidation layer 214 are formed over the entire surface of the semiconductor substrate 100 in the cell area C and the peripheral circuit area P on which the spacers 206 have been formed. Subsequently, predetermined portions of the first interlevel dielectric layer 212 and the bit line anti-oxidation layer 214 are etched using a mask (not shown) to form first contact holes exposing the drain regions 203 of the transistors T12, T13, and T15 in the cell area C, and second and third contact holes exposing the metal or metal silicide patterns 210 of the transistors T16 and T18 and the drain region 203 of the transistor T17, respectively, in the peripheral circuit area P. In particular, the second and third contact holes formed in the peripheral circuit area P serves to alleviate a burden on etching during a process of forming a metal wiring contact hole.

Meanwhile, if the gate electrode capping patterns 211 and the spacers 206 are composed of a material having high selectivity with respect to the first interlevel dielectric layer 212, the first through third contact holes are etched by the gate electrode capping pattern 211 and the spacer 206 in a self-aligned manner. Here, the first interlevel dielectric layer 212 may be formed of a silicon nitride layer, a silicon oxide layer, a phosphosilicate glass (PSG) layer, a borosilicate glass (BSG) layer, a borophospho-silicate glass (BPSG) layer, a tetraethylorthosilicate (TEOS) layer, an ozone-TEOS layer, a plasma enhanced-TEOS (PE-TEOS) layer or an undoped silicate glass (USG) layer, or a combination thereof. The gate electrode capping patterns 211 and the spacers 206 may be composed of a different material from the first interlevel dielectric layer 212, such as a silicon nitride layer, an aluminum oxide layer, a tantalum oxide layer or a silicon carbide layer, or a combination thereof.

Figure 10:
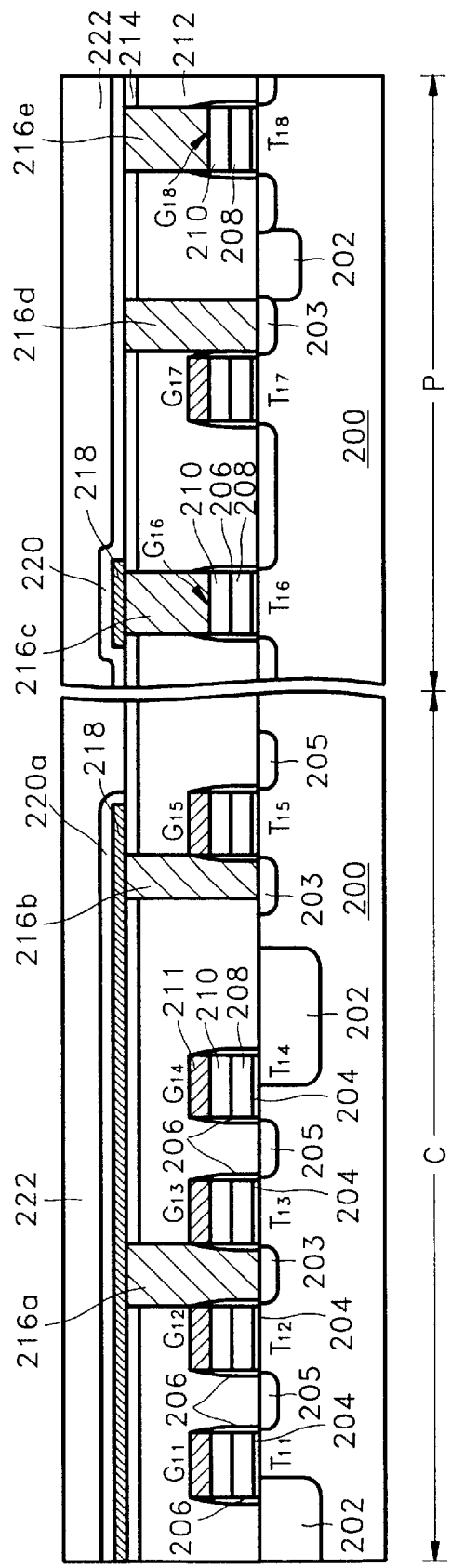

Next, a conductive polysilicon layer 216 is formed over the entire surface of the semiconductor substrate 200 to fill the first through third contact holes. In FIG. 10, the polysilicon layer 216 is subjected to etchback or chemical mechanical polishing (CMP) until the top surface of the bit line anti-oxidation layer 214 is substantially exposed to form first bit line contact connectors 216a and 216b connected to the drain regions 203 of the transistors T12 and T15 through the first contact holes in the cell area C. Second bit line contact connectors 216c and 216e connected to the top surfaces of the gate electrodes G16 and G18 of the transistors T16 and T18 through the second contact holes, and a third bit line contact connector 216d connected to the drain region 203 of the transistor T17 through the third contact hole are formed in the peripheral circuit region P. Here, the top surface of the bit line anti-oxidation layer 214 being "substantially" exposed means both the case in which the top surface of the bit line anti-oxidation layer 214 is ideally exposed without etching and the case in which a portion thereof is actually etched.

Next, a metal anti-diffusion layer and a metal layer are formed over the semiconductor substrate 200 including the first through third bit line connectors 216a, 216b, 216c, 216d, and 216e and patterned to form a bit line 218 in the cell area C and the peripheral circuit area P. The metal anti-diffusion layer may be formed of titanium nitride (TiN) or titanium tungsten (TiW), while the metal layer may be formed of Ti, W or Al. Meanwhile, the metal anti-diffusion layer and the metal layer may be used instead of the polysilcon layer 216 to fill the first through third contact holes.

After forming a capping layer (not shown) for protecting bit line 218 over the entire surface of the semiconductor substrate 200 on which the bit line 218 has been formed, using a mask (not shown) for masking the peripheral circuit area P, etchback is performed to form a bit line capping pattern 220a. The bit line capping layer 220 formed in the peripheral circuit area P is not removed, but is formed on the bit line 218, the second and third bit line contact connectors 216d and 216e, and the bit line anti-oxidation layer 214. After having performed the etchback process, the bit line capping pattern 220a is formed on the cell area C, while the bit line capping pattern 220 is formed on the peripheral circuit area P.

Figure 11:
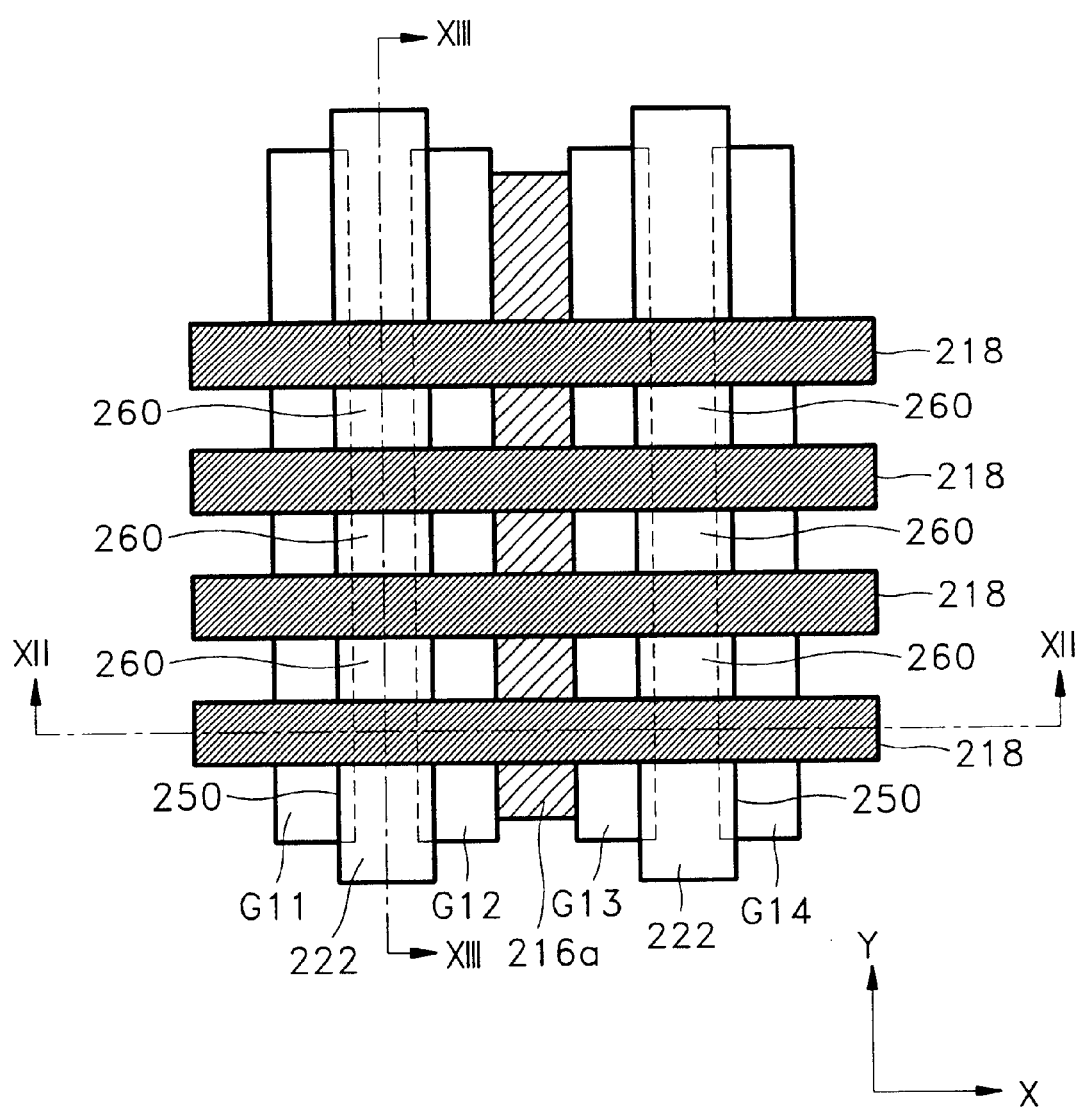

Next, a second interlevel dielectric layer 222 formed of the same or equivalent material as the first interlevel dielectric layer 212 is formed over the entire surface of the semiconductor substrate 200, and then a line-type self-aligned mask (270 of FIG. 12) exposing only a portion denoted by reference numeral 250 as shown in FIG. 11 is positioned on the second interlevel dielectric layer 222.

Figure 12:
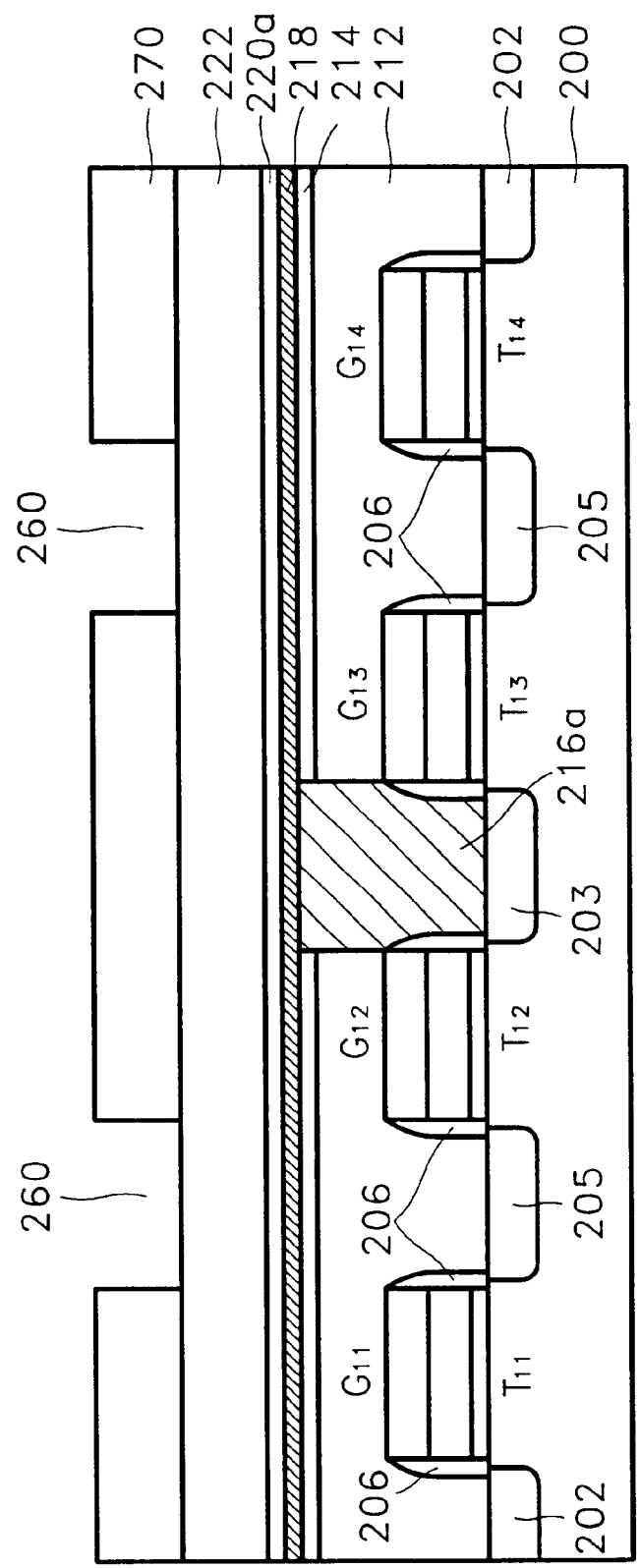

FIG. 12 is a cross-sectional view of the cell area C of a semiconductor memory device taken along line XII—XII of FIG. 11, on which the line-type self-aligned mask 270 has been formed on the second interlevel dielectric layer 222. In FIG. 11, the bit lines 218 extend in the X-axis direction and are arranged parallel to each other with respect to the Y-axis direction, while the gate electrodes G11, G12, G13, and G14 extend in the Y-axis direction and are arranged parallel to each other with respect to the X-axis direction. The first interlevel dielectric layer 212 and the bit line anti-oxidation layer 214 disposed between the gate electrodes G11, G12, G13, G14, and G15 and the bit line 218, and the bit line capping pattern 220a for covering the bit line 218, are not shown in FIG. 11. Furthermore, a portion denoted by reference numeral 260 in FIG. 11 represents a portion where a lower electrode contact hole will later be formed.

Meanwhile, as shown in FIG. 12, bit line connector 216a as formed within the first contact hole in a self-aligned manner by the spacer 206 of the gate electrode G12 and the spacer 206 of the gate electrode G13 as previously described with respect to FIG. 9, connects the drain region 203 of the transistors T12 and T13 and the bit line 218. The bit line capping pattern 220a and the second interlevel dielectric layer 222 are sequentially formed on the bit line 218. The line-type self-aligned photoresist mask pattern 270 is formed on the second interlevel dielectric layer 222. The line-type self-aligned mask 270 exposes the second interlevel dielectric layer 222 at the source region 205 of the transistors T11 and T12 and the source region 205 of the transistors T13 and T14.

Figure 13:
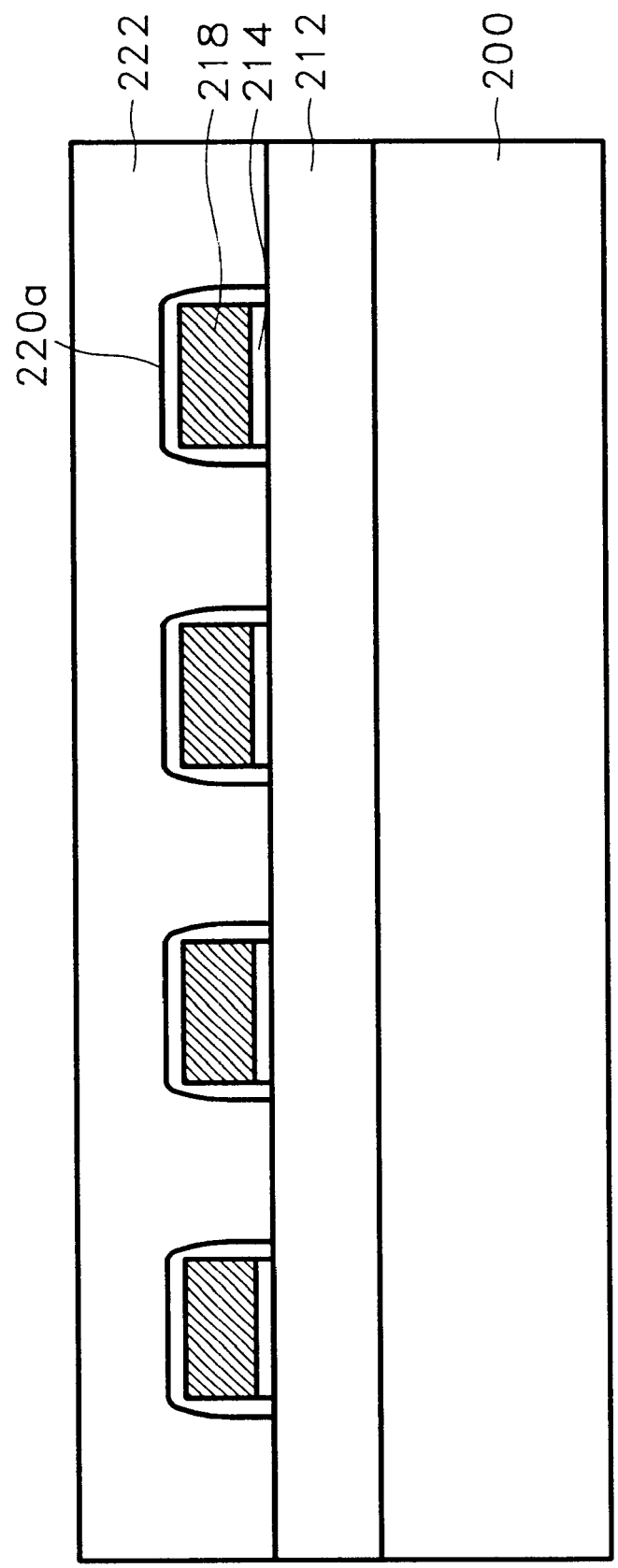

FIG. 13 is a cross-sectional view of the cell area C of a semiconductor memory device taken along line XIII—XIII of FIG. 11, on which the first interlevel dielectric layer 212 has been formed on the semiconductor substrate 200. The bit line anti-oxidation layer 214, the bit line 218, and the bit line capping pattern 220a are sequentially formed on the first interlevel dielectric layer 212. Next, the second interlevel dielectric layer 222 is formed over the entire surface of the semiconductor substrate 200 including the bit line capping pattern 220a. The line-type self-aligned photoresist mask pattern 270 is not formed on the second interlevel dielectric layer 222 in this view, which means that the photoresist mask pattern 270 is not formed on the bit line 218.

Figure 14:
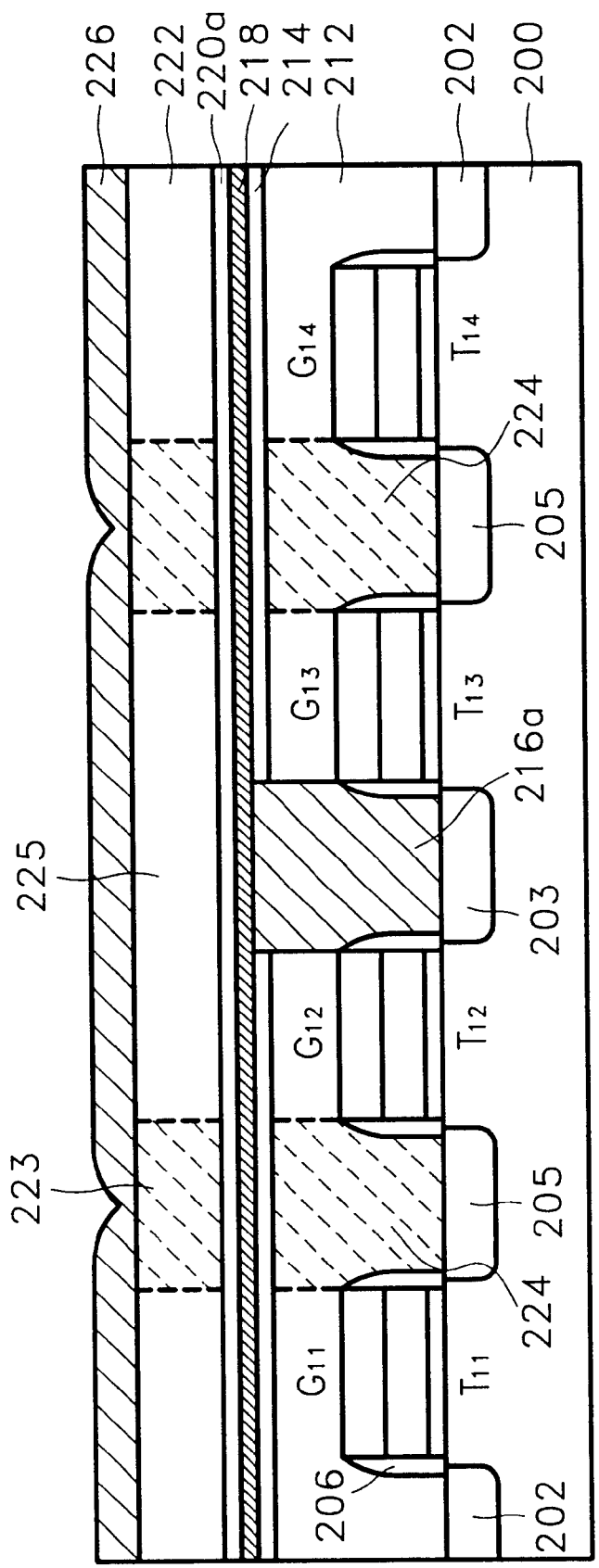
Figure 15:
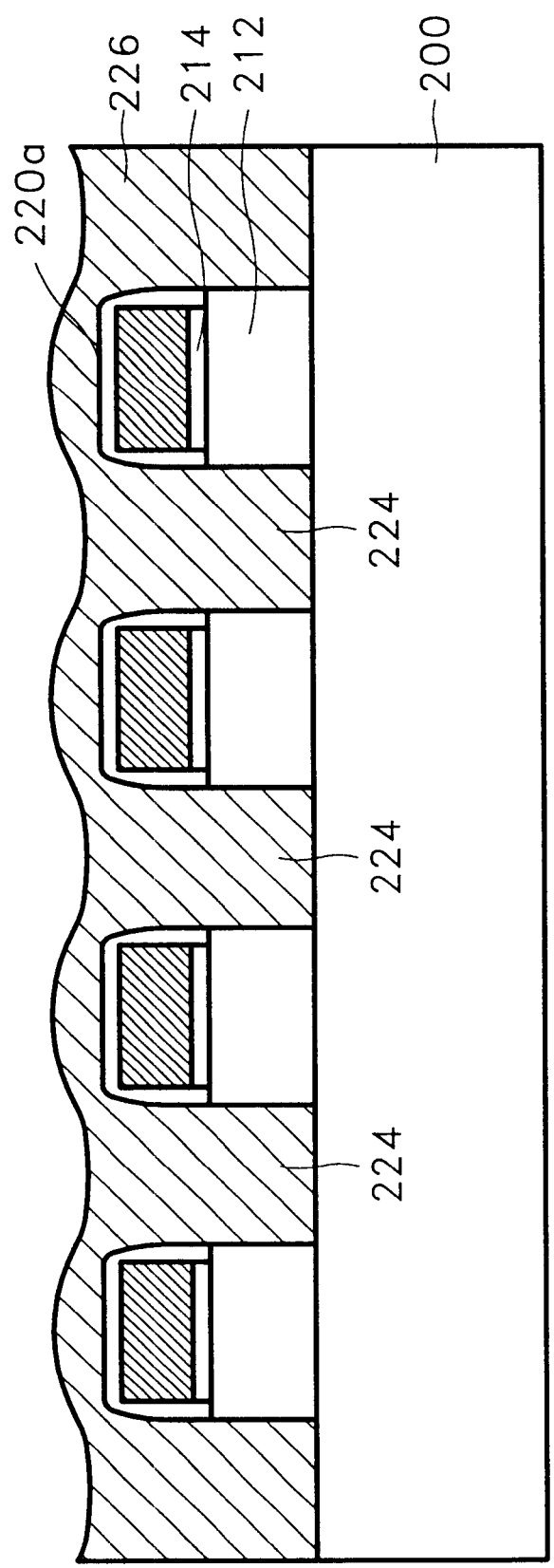

Next, using the line-type self-aligned mask 270 an etching process for forming a lower electrode contact hole is performed. FIGS. 14 and 15 show subsequent manufacture states of FIG. 12 which is a cross-sectional view taken along line XII—XII of FIG. 11, and FIG. 13 which is a cross-sectional view taken along line XIII—XIII of FIG. 11, respectively.

Referring to FIG. 14, the second interlevel dielectric layer 222 corresponding to portions 260 between bit lines 218 exposed by the line-type self-aligned photoresist mask pattern 270 and the underlying first interlevel dielectric layer are etched to form a recess 223 and a projection 225. A plurality of grooves 224 etched in a self-aligned manner by the bit line capping pattern 220a are separately disposed within the recess 223 between the bit lines 218, as shown in FIG. 15. Then, following removal of the line-type self-aligned photoresist mask 270, a polysilicon layer 226 is formed of polysilicon, which is a conductive material, over the entire surface of the semiconductor substrate 200 on which the recess 223, the projection 225, and the grooves 224 have been formed. In FIG. 14, the grooves having polysilicon therein and being between bit lines 218 as corresponding to portions 260, are shown by dashed lines.

Figure 16:
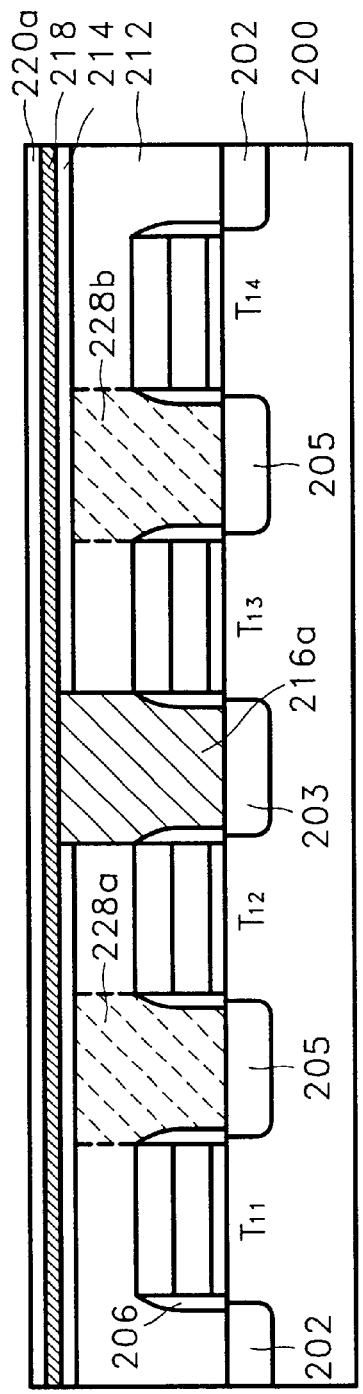
Figure 17:
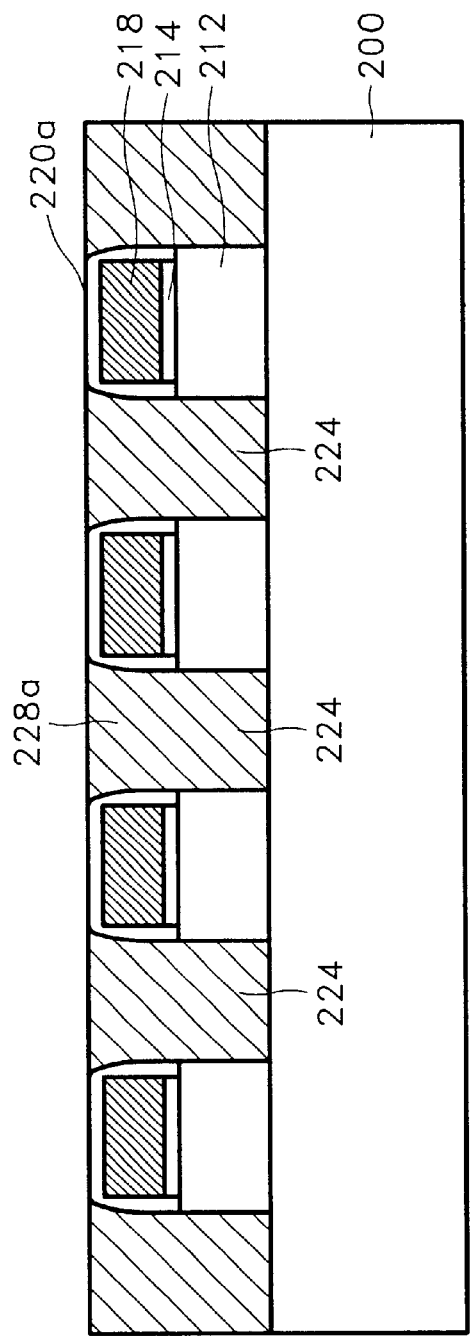

Next, when etchback or CMP is performed over the entire surface of the semiconductor substrate until the top surface of the bit line capping pattern 220a is substantially exposed, as shown in FIGS. 16 and 17, a plurality of lower electrode connectors 228a and 228b (shown by dashed lines in FIG. 16), which are separated in the X- and Y-axis directions, respectively, are formed. That is, the top surface of the lower electrode connector 228a is on a level with the top surface of the bit line capping pattern 220a. Here, the top surface of the bit line capping pattern 220a being "substantially" exposed means both the case in which the top surface of the bit line capping pattern 220a is exposed without etching and the case in which a portion thereof is etched.

Figure 18:
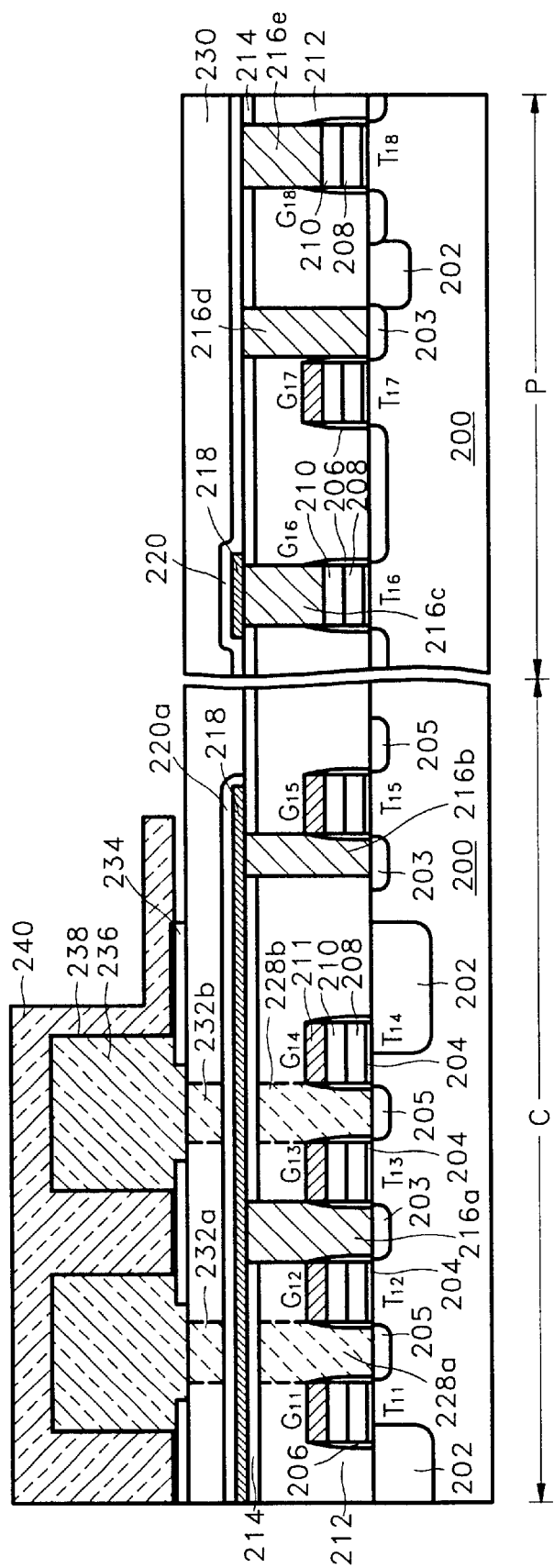

For a subsequent process for forming a capacitor, as shown in FIG. 18, a planarized third interlevel dielectric layer 230 having a fifth contact hole for forming a capacitor lower electrode and an etching stop layer 234 are formed over the semiconductor substrate 200 including the lower electrode connectors 228a and 228b. After plugs 232a and 232b are formed by filling the fifth contact hole with a conductive material, a lower electrode 236 of a capacitor is formed. Then, a dielectric layer 238 and an upper electrode 240 are sequentially formed on the lower electrode 236.

Figure 19:
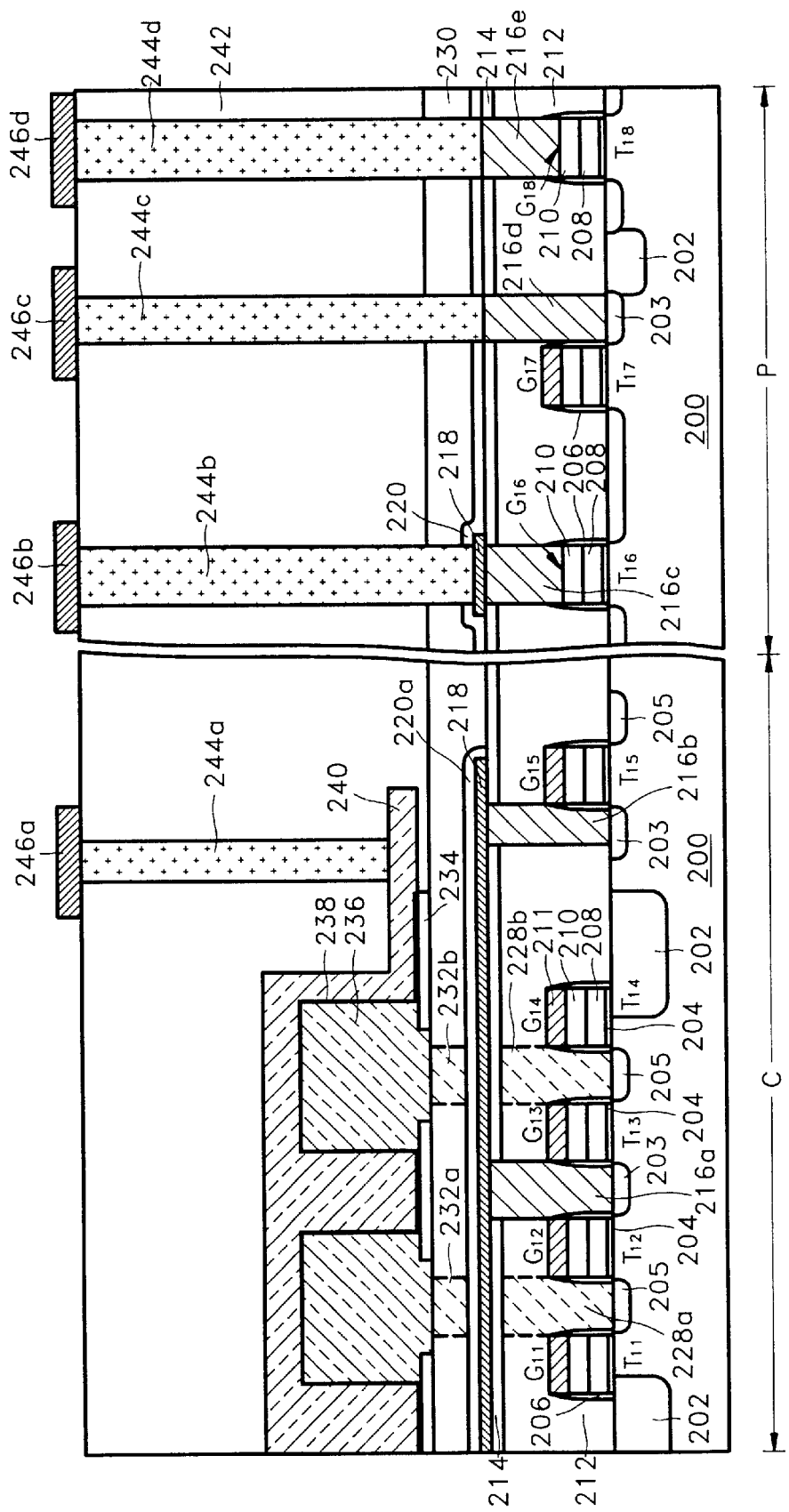

In FIG. 19, a planarized fourth interlevel dielectric layer 242 is formed over the entire surface of the semiconductor substrate 200 on which the capacitor has been formed. Subsequently, the fourth interlevel dielectric layer 242 is etched to form a sixth contact hole exposing a portion of the upper electrode 240 on the cell area. After forming the sixth contact hole, the fourth interlevel dielectric layer 242, the third interlevel dielectric layer 230 and the bit line capping pattern 220 on the peripheral circuit area P are removed to form seventh through ninth contact holes exposing the top surface of the bit line 218 overlying the second bit line connector 216c, third bit line connector 216d and second bit line connector 216e, respectively.

After a polysilicon layer (not shown) or a metal layer (not shown) are formed on the fourth interlevel dielectric layer 242 on which the sixth through ninth contact holes have been formed, etchback or CMP is performed to form metal wiring contact plugs 244a, 244b, 244c, and 244d for filling the sixth through ninth contact holes. Subsequently, after forming a metal layer (not shown), the metal layer is patterned to form metal wiring contact pads 246a, 246b, 246c and 246d.

The chief advantages of the present invention are as follows. First, considering that one mask is used to form the bit line connector 216a in the cell area C, and one mask is used to form the lower electrode connectors 228a and 228b, respectively, the number of masks is reduced compared to conventional processes. Thus, a fabrication process attendant on the manufacture and removal of masks is simplified.

Second, since the bit line connector 216a and the lower electrode connectors 228a and 228b are formed by one-time etching process and one-time conductive material filling process (See FIG. 9), they have no contact surfaces within them, thereby suppressing an increase in resistance. In particular, since the lower electrode connectors 228a and 228b are simply slightly longer (higher) than the bit line connector 216a, resistance can decrease by reducing the length of the lower electrode connectors 228a and 228b.

Third, when forming a bit line contact hole on the cell area C, (lower) metal wiring contact holes are formed on the peripheral circuit area P. Thus, a burden on an etching process is reduced compared to the case in which all interlevel dielectric layers including the fourth interlevel dielectric layer 242 overlying the capacitor are etched to form metal wiring plugs.

Fourth, by the line-type self-aligned mask 270, a photoresist is not formed on the bit line 218, positioned on the source region 205, which is peripheral to the direction in which the gate electrodes extend. Thus, a bridge defect between the lower electrode connectors due to low selectivity between the photoresist and the underlying interlevel dielectric layer 222 does not occur.

Fifth, since a lower electrode contact hole is formed in a self-aligned manner using the line-type photoresist mask pattern 270, a bridge defect between the lower electrode contact plugs does not occur although misalignment occurs in the direction of bit line arrangement.

Sixth, the bit line anti-oxidation layer 214 formed simultaneously on the cell area C and the peripheral circuit area P is used to prevent oxidation of the bit line 218 on the cell area, while it is used as an etching stop layer on the peripheral circuit area P during a subsequent process of forming (upper) metal wiring contact holes.

Furthermore, during a process of forming a bit line capping pattern 220a, etchback is performed only over the cell area C, thereby reducing a burden on the etchback process. In addition, the bit line capping pattern 220a can serve as an etching stop layer on the peripheral circuit area P during a process of forming the upper metal wiring contact holes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor memory device comprising:

preparing a substrate;

forming transistors on the substrate, each transistor having a gate electrode structure including a gate electrode, a gate electrode capping pattern formed on the gate electrode, and sidewall spacers formed on sidewalls of the gate electrode and the gate electrode capping pattern, and having a source region and a drain region;

forming a first interlevel dielectric layer including a bit line contact hole, over an entire surface of the substrate including the transistors and which has high selectivity with respect to the gate electrode capping pattern and the sidewall spacers;

forming a bit line connector electrically connected to a drain region of at least one of the transistors, by filling the bit line contact hole with a conductive material;

forming a bit line on the first interlevel dielectric layer including the bit line connector;

forming a bit line capping pattern covering the bit line;

forming a second interlevel dielectric layer, having high selectivity with respect to the gate electrode capping pattern and the sidewall spacers, over an entire surface of the first interlevel dielectric layer including the bit line capping pattern;

forming a mask pattern on the second interlevel dielectric layer which exposes a portion of the second interlevel dielectric layer corresponding to a source region of at least one of the transistors and which extends along a direction of the bit line;

etching the first and second interlevel dielectric layers using the mask pattern to form a capacitor lower electrode contact hole exposing the source region of the at least one of the transistors;

filling the capacitor lower electrode contact hole from a bottom thereof up to a top surface of the bit line capping pattern with the conductive material, to form a capacitor lower electrode connector positioned at a same level as the bit line capping pattern; and forming a capacitor on the capacitor lower electrode connector, the capacitor including a lower electrode, a dielectric layer, and an upper electrode.

2. The method of claim 1, wherein said etching to form the capacitor lower electrode contact hole comprises removing an entire exposed portion of the second interlevel dielectric layer and etching the first interlevel dielectric layer using the bit line capping pattern.

3. The method of claim 1, wherein said filling to form the capacitor lower electrode connector comprises:

forming a conductive material layer over an entire surface of the substrate including the capacitor lower electrode contact hole; and performing chemical mechanical polishing (CMP) or etchback over an entire surface of the substrate including the conductive material layer, until the top surface of the bit line capping layer is substantially exposed.

4. The method of claim 3, wherein said filling to form the capacitor lower electrode connector comprises:

forming a conductive material layer over an entire surface of the substrate including the capacitor lower electrode contact hole; and performing chemical mechanical polishing (CMP) or etchback over an entire surface of the substrate including the conductive material layer, until the top surface of the bit line capping layer is substantially exposed.

5. The method of claim 1, wherein said forming a first interlevel dielectric layer comprises:

forming the first interlevel dielectric layer;

forming a material layer on the first interlevel dielectric layer that prevents oxidation of the bit line; and etching the material layer and the first interlevel dielectric layer to form the bit line contact hole.

6. The method of claim 1, wherein said forming a bit line connector comprises:

forming the conductive material on the first interlevel dielectric layer including the bit line contact hole; and performing CMP or etchback on the conductive material until a top surface of the first interlevel dielectric layer is substantially exposed.

7. The method of claim 1, wherein the first and second interlevel dielectric layers are selected from a group consisting of a silicon oxide layer, a silicon nitride layer, a borosilicate glass (BSG) layer, a borophospho-silicate glass (BPSG) layer, a tetraethylorthosilicate (TEOS) layer, an ozone-TEOS layer, a plasma enhanced-TEOS (PE-TEOS) layer, an undoped silicate glass (USG) layer, and a combination thereof, the gate electrode capping pattern, the bit line capping pattern and the sidewall spacers being materials different than the first and second interlevel dielectric layers, the materials being selected from a group consisting of a silicon nitride layer, an aluminum oxide layer, a tantalum oxide layer, a silicon carbide layer and a combination thereof.

8. The method of claim 5, wherein the material layer is a silicon nitride layer or a silicon oxynitride layer.

* * * * *